United States Patent
Dray et al.

(10) Patent No.: US 9,875,783 B2
(45) Date of Patent: Jan. 23, 2018

(54) HIGH VOLTAGE TOLERANT WORD-LINE DRIVER

(71) Applicant: Intel Corporation, Santa Clara, CA (US)

(72) Inventors: Cyrille Dray, Hillsboro, OR (US); Liqiong Wei, Portland, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/115,455

(22) PCT Filed: Mar. 3, 2014

(86) PCT No.: PCT/US2014/019917
§ 371 (c)(1),
(2) Date: Jul. 29, 2016

(87) PCT Pub. No.: WO2015/133987
PCT Pub. Date: Sep. 11, 2015

(65) Prior Publication Data
US 2017/0169874 A1    Jun. 15, 2017

(51) Int. Cl.
*G11C 8/08* (2006.01)
*G11C 11/16* (2006.01)
*G11C 11/408* (2006.01)

(52) U.S. Cl.
CPC ............ *G11C 11/1697* (2013.01); *G11C 8/08* (2013.01); *G11C 11/4085* (2013.01)

(58) Field of Classification Search
CPC ..................... G11C 8/08; G11C 11/4085

USPC ...................................................... 365/230.06
See application file for complete search history.

(56) References Cited

U.S. PATENT DOCUMENTS

| | | | | |
|---|---|---|---|---|
| 4,893,275 A * | 1/1990 | Tanaka | ................... | G11C 16/12 323/313 |
| 5,751,643 A * | 5/1998 | Lines | .................. | G11C 11/4085 365/189.11 |
| 7,277,315 B2 * | 10/2007 | Yuan | ..................... | G11O 5/145 365/149 |
| 7,283,406 B2 * | 10/2007 | Lu | .......................... | G11C 16/10 365/189.09 |
| 7,586,333 B1 | 9/2009 | Raghavan et al. | | |
| 7,706,207 B2 * | 4/2010 | Liston | .................... | G11O 5/144 365/189.11 |
| 8,238,192 B2 | 8/2012 | Nii | | |
| 8,705,268 B2 * | 4/2014 | Buer | ........................ | G11C 8/08 365/154 |

(Continued)

OTHER PUBLICATIONS

Notification Concerning Transmittal of International Preliminary Report on Patentability issued for International Patent Application No. PCT/US2014/019917, dated Sep. 15, 2016.

(Continued)

*Primary Examiner* — Son Mai
(74) *Attorney, Agent, or Firm* — Blakely, Sokoloff, Taylor & Zafman LLP

(57) ABSTRACT

Described is a word-line driver which is operable to switch a voltage level of a word-line to one of: first power supply, second power supply, or third power supply wherein the voltage level of the second power supply is higher than the voltage level of the first power supply, and wherein transistors of the word-line driver have same gate oxide thicknesses.

17 Claims, 8 Drawing Sheets

(56) References Cited

U.S. PATENT DOCUMENTS

| | | | |
|---|---|---|---|
| 2001/0020840 A1* | 9/2001 | Kojima | G11C 8/08 |
| | | | 323/282 |
| 2007/0133317 A1 | 6/2007 | Yuan et al. | |
| 2008/0181034 A1 | 7/2008 | Hunter et al. | |
| 2011/0199837 A1 | 8/2011 | Reohr et al. | |
| 2012/0235720 A1 | 9/2012 | Jiang et al. | |

OTHER PUBLICATIONS

International Search Report for PCT/US2014/019917 dated Feb. 12, 2015, 2 pages.
Written Opinion of the International Searching Authority for PCT/US2014/019917 dated Feb. 12, 2015, 4 pages.

* cited by examiner

HIGH VOLTAGE TOLERANT WORD-LINE DRIVER

RELATED APPLICATION

This patent application is a U.S. National Phase Application under 35 U.S.C. § 371 of International Application No. PCT/US2014/019917, filed Mar. 3, 2014, entitled HIGH VOLTAGE TOLERANT WORD-LINE DRIVER.

BACKGROUND

Some memory technologies require memory cells to be biased beyond the baseline technology voltage limits. For example, in embedded DRAM (Dynamic Random Access Memory) and STT-MRAM (Spin Transfer Torque Magnetic Random Access Memory) a higher voltage (i.e., higher than nominal operating voltage) may be needed for performing read and/or write operation. One problem with using high voltages (i.e., voltages higher than process technology node nominal voltage) is to design memory peripheral circuits able to withstand the high voltage. An example of a memory peripheral circuit is a word-line driver that drives word-line for the memory cells. Known word-line drivers use thick gate oxide transistors to withstand the high voltage when providing high voltage to a word-line.

However, thick gate oxide transistors increase process complexity. For example, the process node has to provide transistors with thin gate oxide (i.e., normal transistors) and transistors with thick gate oxide (i.e., special transistors). Thick gate oxide transistors may also increase memory size because thick gate oxide transistors are larger in size than thin gate oxide transistors and may also use larger area due to design rule requirements.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
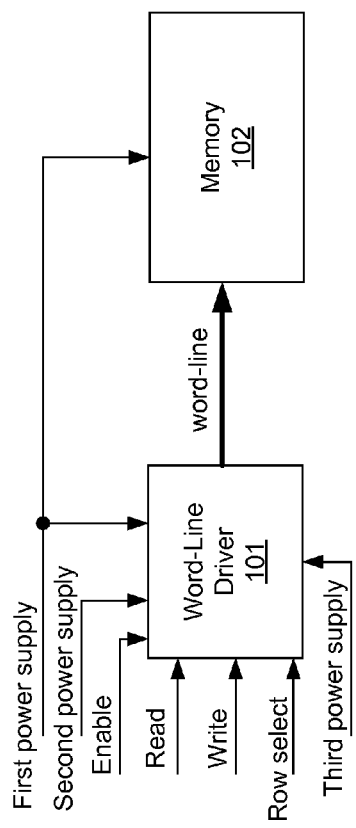
FIG. 1 illustrates a memory system with a high-voltage tolerant word-line driver which is operable to switch voltages on a word-line between three different power supplies, according to one embodiment of the disclosure.

Some embodiments describe a high-voltage tolerant yet dense word-line driver which uses only thin gate oxide transistors. In one embodiment, the high-voltage tolerant word-line driver exploits an STT-MRAM in-plane technology specific asymmetric read and writes latencies, as well as operating voltages. For STT-MRAMs, a read access time may be in the order of 3 ns while a write operation may be completed in about 10 ns to 20 ns. A read operation for STT-MRAMs typically requires a voltage supply less than or equal to the technology Vmax (e.g., 1.15V) while write operation for STT-MRAMs may require greater than Vmax voltage supply (e.g., 1.3V). In one embodiment, the high-voltage tolerant word-line driver decouples read and write operations. In such an embodiment, the high-voltage tolerant word-line driver enables optimization of the read path for speed (e.g., faster word-line rising edge slew rate) and the write path (e.g., for higher area density since there is less need for aggressive word-line slew rates).

In one embodiment, the high-voltage tolerant word-line driver comprises three sub-circuits coupled together such that each of the sub-circuits is operable to drive the word-line. In one embodiment, the first sub-circuit is a fast bootstrap circuit that handles the read path. In one embodiment, the second sub-circuit is a stack-transistor with level-shifted gate control for the write path. In one embodiment, the third sub-circuit is a stack-transistor to ground the word-line. By interconnecting the first and second sub-circuits, in one embodiment, the high-voltage tolerant word-line driver saves two instances of conventional area-consuming high voltage level-shifters. In one embodiment, the high-voltage tolerant write-driver implements a level shifter with reduced contention during switching i.e., it allows reducing critical transistors size to improve area density while ensuring switching robustness.

In one embodiment, the fast bootstrap circuit is the lowest count transistor circuit and fastest for driving word-line to a first power supply (e.g., VCC) and for entering tri-state when the word-line is raised above the first power supply. In one embodiment, the high-voltage tolerant word-line driver is operable to drive the word-line to three different voltages in a mutually exclusive manner. For example, the high-voltage tolerant word-line driver is operable to drive the word-line to: VSS (also referred here as the third power supply) in idle state or unselected state; read voltage (also referred here as the first power supply), for instance 1.1V, with an aggressive slew rate; and write voltage (also referred here as the second power supply), for instance 1.3V, with a relaxed slew rate. In one embodiment, the high-voltage word-line driver decouples read and write paths to enable advanced power savings modes to gate read path leakage when memory performs write operations (and vice-versa). Examples of advanced power saving modes are detailed in the Advanced Configuration and Power Interface (ACPI) specification Revision 5.0 published Dec. 6, 2011.

There are many technical effects of the embodiments. For example, the embodiments can withstand a high voltage in idle state (e.g., DC) using only thin gate oxide transistors. So some embodiments inherently achieve greater area density.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFET transistors, Gate All Around Cylindrical Transistors or other devices implementing transistor functionality like carbon nanotubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 illustrates a memory system 100 with high-voltage tolerant word-line driver 101 which is operable to switch voltages on a word-line between three different power supplies, according to one embodiment of the disclosure. In one embodiment, word-line driver 101 drives word-line for memory 102. In one embodiment, memory 102 is an SRAM (Static Random Access Memory). For example, a 4T (i.e., four transistor) SRAM, 6T SRAM, 8T SRAM (e.g., a Register File), or a 10T SRAM. In one embodiment, memory 102 is an MRAM (Magnetic Random Access Memory). In one embodiment, memory 102 is a resistive memory (e.g., memory based on magnetic tunneling junction device). In other embodiments, memory 102 is any memory type.

In one embodiment, word-line driver 101 receives First, Second, and Third power supplies, where Second power supply is higher than the First power supply. For example, the First power supply is nominal power supply (e.g., 1V) while the Second power supply is the high-voltage power supply (e.g., 1.3V). In one embodiment, the Third power supply is ground. In one embodiment, memory 102 also operates on the First power supply, and receives word-line which can switch between the First, Second, and Third power supplies without causing reliability issues (e.g., oxide break down of the devices in word-line driver 101).

In one embodiment, word-line driver 101 receives Enable, Read, Write, and Row select signals on Enable, Read, Write, and Row select lines respectively, and adjusts voltage level of word-line according to logic levels of Read, Write, and Row select signals. For example, during Write operation and when word-line driver 101 is selected by Row select signal, word-line is raised to Second power supply. In one embodiment, during Read operation and when word-line driver 101 is selected by Row select signal, word-line is raised to First power supply. In one embodiment, during idle operation (e.g., when word-line driver is un-selected, then word-line driver 101 drives a Third power supply on word-line. In one embodiment, the Third power supply is one of ground, a voltage higher than ground, or a voltage lower than ground.

In one embodiment, the above functions of switching voltage level of word-line during Read, Write, and Idle operations can be switched using a Select signal. For example, in one embodiment, during Read operation and when word-line driver 101 is selected by Row select signal, word-line is raised to the Second power supply instead of the First power supply. In one embodiment, word-line driver includes an integrated level-shifter instead of traditional cross-coupled discrete level-shifters.

Figure 2:
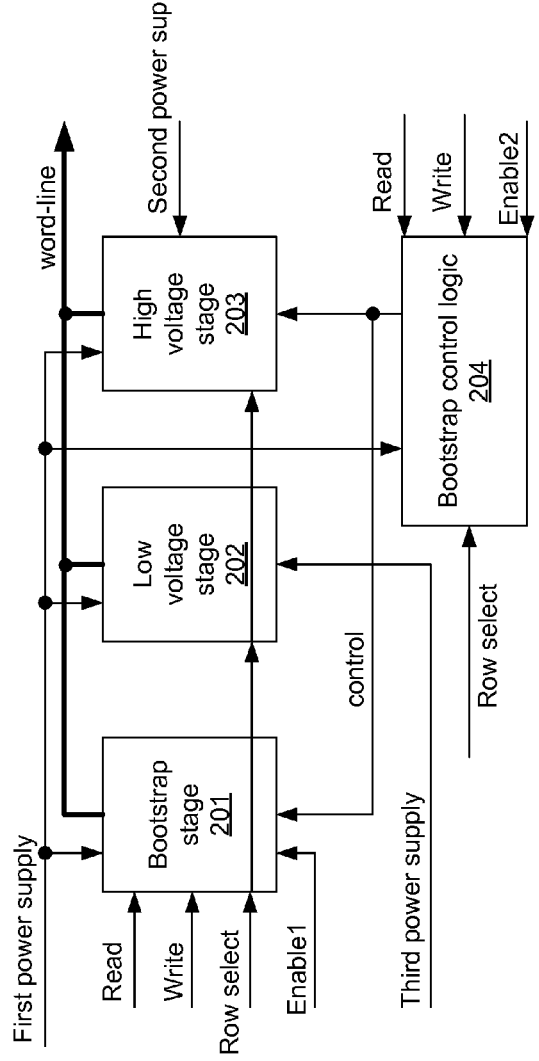
FIG. 2 illustrates a high-level circuit of the high-voltage tolerant word-line driver, according to one embodiment of the disclosure.

FIG. 2 illustrates a high-level circuit 200 of the high-voltage tolerant word-line driver 101, according to one embodiment of the disclosure. It is pointed out that those elements of FIG. 2 having the same reference numbers (or names) as the elements of any other figure can operate or function in any manner similar to that described, but are not limited to such.

In one embodiment, circuit 200 comprises Bootstrap stage 201, Low-voltage stage 202, High-voltage stage 203, and Bootstrap control unit 204. In one embodiment, Bootstrap stage 201 receives Read, Write, Row select, and Enable1 lines, and First power supply. In one embodiment, Bootstrap stage 201 is the lowest count transistor circuit and fastest for driving word-line to the First power supply (e.g., VCC) and for entering tri-state when word-line is raised above the First power supply. In one embodiment, Bootstrap stage 201 receives Enable1 signal to enable Bootstrap stage 201 according to one of Read or Write signals.

In one embodiment, Low-voltage stage 202 comprises a pull-down circuit which is operable to pull-down word-line to the Third power supply (e.g., Vss, Vss+10 mV, Vss−10 mV). In one embodiment, the pull-down circuit comprises a cascode circuit with one transistor always turned ON by the First power supply and another transistor controllable by the Row select signal. While circuit 200 shows receiving Row select signal, it is understood that Row select_b (i.e., inverse of Row select signal) when needed is also provided. In one embodiment, during idle mode, Low-voltage stage 202 pulls down the word-line to the Third power supply (e.g., ground).

In one embodiment, High-voltage stage 203 includes an integrated level-shifter (without traditional cross-coupling) and is operable to raise word-line to the Second power supply with little overstress, if any, on devices. In one embodiment, when High-voltage stage 203 is enabled (e.g., when Write operation is being performed and Row select signal indicates that circuit 200 is selected) then a transistor coupled to the Second power supply is biased such that it is weakly turned ON which reduces voltage difference across the gate oxide of that transistor.

In one embodiment, Bootstrap control logic 204 is a two input NAND gate which receives Write signal and Row select signals as inputs and provides Bootstrap control signal (also referred here as "control" signal) as output. In one embodiment, Bootstrap control logic 204 includes a logic unit (e.g., a multiplexer) which allows multiplexing between Read and Write signals using an Enable2 signal before providing one of Read or Write signals as input to the NAND gate. In one embodiment, Enable2 signal is an inverse of Enable1 signal. In such an embodiment, word-line voltage adjustment can be changed for Read and Write operations.

In one embodiment, Bootstrap control signal tri-states Bootstrap stage 201. Here, labels for signals and nodes are interchangeably used. For example, "control" may refer to control node or control signal depending on the context of the sentence. In one embodiment, the First and Second power supplies can be lowered during low power mode (e.g., Sleep mode) to enable low power operation of word-line driver 200. In one embodiment, all devices of circuit 200 are thin gate oxide devices.

Figure 3:
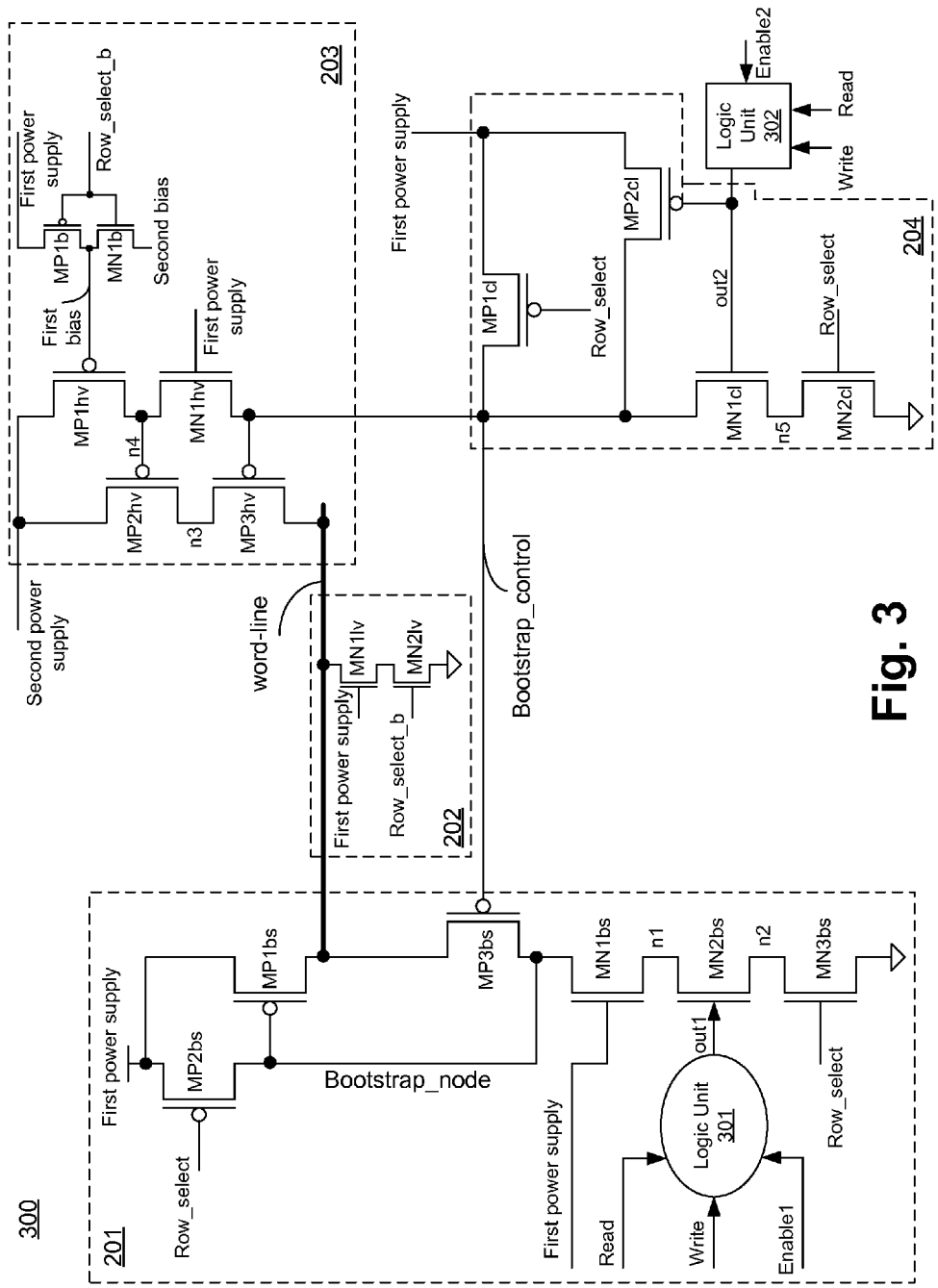
FIG. 3 illustrates a circuit of the high-voltage tolerant word-line driver, according to one embodiment of the disclosure.

FIG. 3 illustrates a circuit 300 of the high-voltage tolerant word-line driver 200 (i.e., 101), according to one embodiment of the disclosure. It is pointed out that those elements of FIG. 3 having the same reference numbers (or names) as the elements of any other figure can operate or function in any manner similar to that described, but are not limited to such. In one embodiment, circuit 300 provides transistor level detail of circuit 200 and includes Bootstrap stage 201, Logic Unit 301, Low voltage stage 202, High voltage stage 203, Bootstrap control logic 204, and Logic Unit 302.

In one embodiment, Bootstrap stage 201 comprises p-type devices MP1$bs$, MP2$bs$, and MP3$bs$; n-type devices MN1$bs$, MN2$bs$, and MN3$bs$. In one embodiment, MP1$bs$ has a source terminal coupled to the First power supply, drain terminal coupled to word-line, and a gate terminal coupled to drain terminal of MP2$bs$. In one embodiment, gate terminal of MP2$bs$ is controllable by Row_select signal on Row select line. In one embodiment, source terminal of MP2$bs$ is coupled to the First power supply. In one embodiment, drain terminal (i.e., Bootstrap node) of MP2$bs$ is coupled to drain terminal of MP3$bs$ and gate terminal of MP1$bs$. In one embodiment, gate terminal of MP3$bs$ is controlled by output (i.e., Bootstrap control) of Bootstrap control logic 204. In one embodiment, source terminal of MP3$bs$ is coupled to word-line. In one embodiment, drain terminal of MP3$bs$ is coupled to drain terminal of MN1$bs$. In one embodiment, the signal path from word-line through MP3$bs$, gate terminal of MP1$bs$ and back to word-line forms the bootstrap loop.

In one embodiment, MN1$bs$, MN2$bs$, and MN3$bs$ are coupled together in series. In one embodiment, gate terminal of MN1$bs$ is controlled by the First power supply. In one embodiment, gate terminal of MN2$bs$ is controlled by Read signal on Read line. In one embodiment, gate terminal of MN2$bs$ is controlled by out1 which is generated by Logic Unit 301. In one embodiment, Logic Unit 301 is a multiplexer that receives Enable1 signal to select one of Read or Write signals to provide as out1. In one embodiment, MN1$bs$ and MN2$bs$ are coupled together via node n1. In one embodiment, MN2$bs$ and MN3$bs$ are coupled together via node n2. In one embodiment, MN3$bs$ is controllable by Row_select signal.

In one embodiment, Low voltage stage 202 comprises n-type transistors MN1$lv$ and MN2$lv$ coupled together in series. In one embodiment, gate terminal of MN1$lv$ is coupled to First power supply, drain terminal of MN1$lv$ is coupled to word-line, and source terminal of MN1$lv$ is coupled to drain terminal of MN2$lv$. In one embodiment, gate terminal of MN2$lv$ is controllable by an inverse of Row_select signal (i.e., Row_select_b signal). In one embodiment, source terminal of MN2$lv$ is coupled to the Third power supply. In one embodiment, the Third power supply is ground. In one embodiment, during idle mode, Low voltage stage 202 is enabled and pulls down word-line to the Third power supply level.

In one embodiment, High voltage stage 203 comprises a biasing stage and an integrated level-shifter. In one embodiment, biasing stage comprises a first p-type transistor MP1$b$ and a first n-type transistor MN1$b$ coupled together in series. In one embodiment, source terminal of MP1$b$ is coupled to First power supply, gate terminal of MP1$b$ is coupled to Row_select_b, and drain terminal of MP1$b$ is coupled to First bias node which provides First bias to p-type MP1$hv$. In one embodiment, drain terminal of MN1$b$ is coupled to First bias node, gate terminal of MN1$b$ is coupled to Row_select_b, and source terminal is coupled to Second bias. In one embodiment, Second bias is generated by a bias generator. One such bias generator is discussed with reference to FIG. 4.

Referring back to FIG. 3, High voltage stage 203 comprises p-type transistors MP1$hv$, MP2$hv$, and MP3$hv$; and n-type transistor MN1$hv$. In one embodiment, gate terminal of MP1$hv$ is biased by First bias. In one embodiment, source terminal of MP1$hv$ is coupled to the Second power supply. In one embodiment, drain terminal (i.e., node n4) of MP1$hv$ is coupled to gate terminal of MP2$hv$ and drain terminal of MN1$hv$. In one embodiment, source terminal of MN1$hv$ is coupled to Bootstrap control node (i.e., output of Bootstrap logic 204) and coupled to the gate terminal of MP3$hv$. In one embodiment, source terminal of MP2$hv$ is coupled to the Second power supply and drain terminal (i.e., node n3) of MP2$hv$ is coupled to source terminal of MP3$hv$. In one embodiment, gate terminal of MP3$hv$ is controlled by Bootstrap control signal. In one embodiment, gate terminal of MN1$hv$ is coupled to the First power supply. In one embodiment, drain terminal of MP3$hv$ is coupled to word-line.

In one embodiment, Bootstrap control logic 204 is a NAND gate which comprises p-type transistors MP1$cl$, MP2$cl$; and n-type transistor MN1$cl$ and MN2$cl$ coupled together as shown. In one embodiment, gate terminals of MP2$cl$ and MN1$cl$ are controlled by Write signal. In one embodiment, gate terminals of MP2$cl$ and MN1$cl$ are controlled by out2 which is generated by Logic Unit 302. In one embodiment, Logic Unit 302 is like Logic Unit 301 but controllable by Enable2 signal. In one embodiment, Enable1 and Enable2 signals are unrelated signals and can be independently controlled. In one embodiment, Enable2 signal is an inverse of Enable1 signal. In one embodiment, MN2*cl* and MP1*cl* are controlled by Row_select signal provided on Row_select line.

In one embodiment, source and drain terminals of MP1*hv*, MP2*hv*, and MP3*hv*; gate terminals of MP2*hv* and MP1*bs*, and drain terminals of MP1*bs*, MP2*bs*, MP3*bs*, and MN1*bs* may be exposed to Second power supply based voltage (i.e., high power supply). A person skilled in the art would know that voltage difference between source/drain terminals and gate terminal causes electric field in the gate oxide, and that the strength of the electric field may cause oxide degradation i.e., reliability issue for the transistor. In one embodiment, Read path drive strength is greater than the Write path drive. The DC voltages of circuit 300 in idle mode, low voltage read mode, high voltage write mode, sleep mode are discussed below. In the following example, which is provided for sake of describing circuit 300; First power supply is 1V, Second power supply is 1.3V, Third power supply is ground, and Second bias is 0.33V.

In Idle mode, all transistors of circuit 300 operate in safe operation area (i.e., no device overstress caused from the Second power supply). In Idle mode, Row_select is 0V (i.e., Row_select_b is equal to the First power supply of 1V), and Read and Write signals are 0V. In one embodiment, Enable1 signal is 0V which causes Logic Unit 301 to select Read signal as out1 while Logic Unit 302 selects Write signal as out2 (i.e., Enable2 may be equal to the First power supply). In this example, Enable2 signal is an inverse of Enable1. In one embodiment, Enable1 and Enable2 signals are unrelated. In other embodiments, Enable1 signal may be different select voltages. With Row_select signal equal to 0V, MP2*bs* is fully turned ON while MN3*bs* is fully turned OFF. This causes Bootstrap_node to rise to 1V. In this example, output (i.e., Bootstrap_control) from Bootstrap control logic 204 is 1V because out2 is 0V and Row_select is 0V. When Bootstrap_control is 1V, MP3*bs* and MP3*hv* are turned OFF. When Bootstrap_node is 1V, MP1*bs* is turned OFF.

During Idle mode, Low voltage stage 202 is turned ON because MN21*v* is turned ON. This causes voltage on word-line to lower down to the Third power supply (e.g., ground). In this example, Row_select_b is 1V which causes the MP1*b* of the biasing circuit to be turned OFF while MN1*b* is turned ON. MN1*b* causes First bias to have Second bias i.e., 0.33V. When First bias is 0.33V, MP1*hv* is strongly turned ON causing node n4 to have 1.3V (i.e., the Second power supply). MP1*hv* is protected from oxide break down by Second Bias, which causes the source and drain terminals of MP1*hv* to be at 1.3V, and gate at 0.33V. In this example, MP2*hv* experiences no stress because its gate and source voltage is 1.3V and by leakage, voltage on node n3 rises to about 0.95V. When voltage on Bootstrap_control node is 1V, MP3*hv* is turned OFF because Vgs of MP3*hv* is less than the threshold voltage of MP3*hv*.

In Read mode, Logic Unit 301 causes out1 to couple to Read line carrying Read signal while Logic Unit 302 causes out2 to couple to Write line carrying Write signal. In Read mode, Read signal is at First power supply level (i.e., 1V) and Write signal is at 0V. During read mode, Row_select is at First power supply level (i.e., 1V) which means that word-line driver 300 is selected. In this mode, Low voltage stage 202 is turned OFF because Row_select_b signal is at 0V which turns OFF MN2*lv*.

During Read mode, MP1*bs*, MN2*bs*, and MN3*bs* of Bootstrap stage 201 are turned ON. This causes voltage on Bootstrap node to be grounded at 0V. When voltage on Bootstrap node is at 0V, MP1*bs* is fully turned ON which causes voltage on word-line to switch from 0V (in idle mode) to the First power supply level (i.e., 1V). During Read mode, Bootstrap control logic 204 (i.e., NAND gate) causes voltage on Bootstrap_control node to be at 1V which in turn causes MP3*bs* to remain OFF.

During Read mode, the DC voltages on nodes of High voltage stage 203 are also in safe operating range. In this mode, voltage on Row_select_b node is 0V which causes MP1*b* to turn ON which in turn couples the First power supply to First bias node. A 1V on First bias node causes MP1*hv* to weakly turn ON because the Second power supply is higher than 1V. Overtime, voltage on node n4 rises to Second power supply level (i.e., 1.3V) because MP1*hv* is weakly ON. This causes MP2*hv* to turn OFF because Vgs of MP2*hv* is 0V. However, due to leakage in MP2*hv*, voltage on node n3 rises to 1.03V. Since voltage on Bootstrap_control node is 1V, MP3*hv* remains OFF which allows voltage on word-line to remain at the First power supply level.

During Write mode, Logic Unit 301 causes out1 to couple to Read line carrying Read signal while Logic Unit 302 causes out2 to couple to Write line carrying Write signal. In Write mode, Write signal is at the First power supply level (i.e., 1V) and Read signal is at 0V. During Write mode, Row_select is at First power supply level (i.e., 1V) which means that word-line driver 300 is selected. In this mode, Low voltage stage 202 is turned OFF because Row_select_b signal is at 0V which turns OFF MN2*lv*.

During Write mode, MN2*bs* is OFF which disconnects path to ground for Bootstrap stage 201. In this example, output of NAND gate (i.e., Bootstrap control stage 203), voltage on Bootstrap control node is 0V which causes MP3*bs* and MP3*hv* to turn ON. Voltage on node First bias is developed similar to in read mode, and is at First power supply level (i.e., 1V). This causes MP1*hv* to weakly turn ON. However, since voltage on Bootstrap_control node is at 0V (i.e., there is a path to ground) and MN1*hv* is always ON, voltage on node n4 is at 0V. This causes MP2*hv* to fully turn ON causing word-line to couple to the Second power supply.

As voltage on word-line rises to 1.3V, voltage on node Bootstrap_node also rises to 1.3V through a turned ON MP3*bs*. This in turn keeps MP1*bs* turned OFF i.e., bootstrapped. In this embodiment, strength of MP1*hv* is dynamically reduced (compared to in idle mode) because MP1*hv* is weakly turned ON by 1V on its gate terminal. This dynamically reduced strength ensures that MP1*hv* switches reliably under process, temperature, and voltage variations even when level-shifter transistors (i.e., MP1*hv*, MN1*hv*, MN1*cl*, and MN2*cl*) are aggressively downsized. In one embodiment, un-selected word-line drivers experience high switching noise margin because MP1*hv* strength is not degraded.

During Write mode, in this embodiment, three transistors are exposed to the high voltage electrical stress from the Second power supply. However, such stress is of little harm, if any, because word-line driver 300 is activated, for example, among typically 512 to 1024 word-line drivers, for memory 102, that are operating in idle (i.e., safe) mode. In one embodiment, the bulk (or substrate) terminals of the p-type transistors in write driver 300 are coupled to the Second power supply. In such an embodiment, leakage is reduced. In one embodiment, the bulk (or substrate) terminals of the p-type transistors in write driver 300 are coupled to the First power supply.

Figure 4:
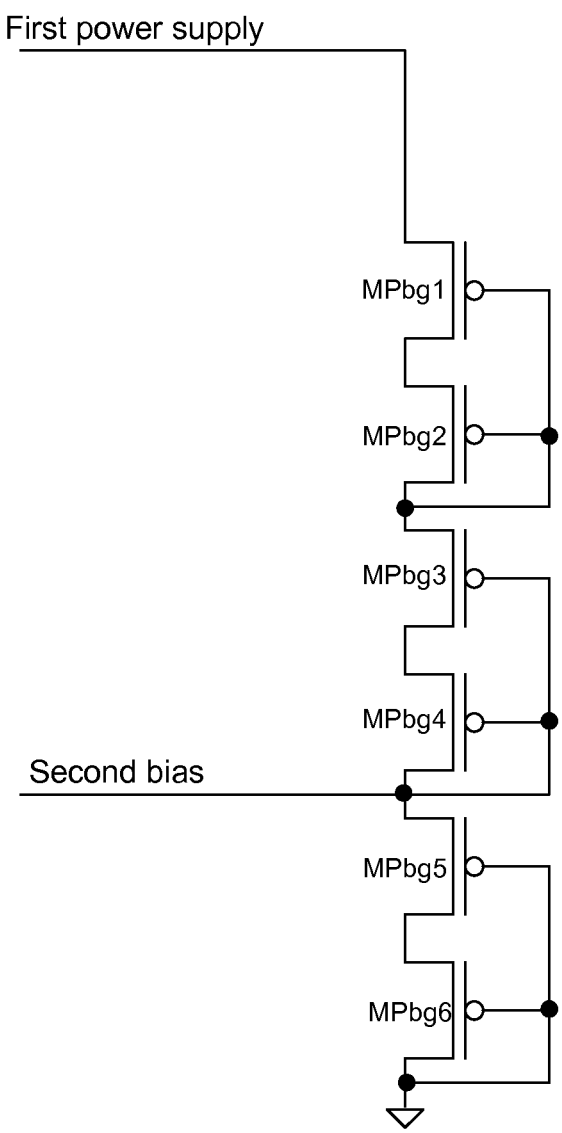
FIG. 4 illustrates a voltage divider for providing a bias to the high-voltage tolerant word-line driver, according to one embodiment of the disclosure.

FIG. 4 illustrates a voltage divider 400 for providing a bias to high-voltage tolerant word-line driver 300, according to one embodiment of the disclosure. It is pointed out that those elements of FIG. 4 having the same reference numbers (or names) as the elements of any other figure can operate or function in any manner similar to that described, but are not limited to such.

In one embodiment, voltage divider 400 comprises p-type transistors MPbg1, MPbg2, MPbg3, MPbg4, MPbg5, and MPpg6 coupled together in series. In one embodiment, gate terminals of MPbg1 and MPbg2 are coupled together such that the gate terminal is coupled to drain terminal of MPbg2. In one embodiment, source terminal of MPbg1 receives First power supply. In one embodiment, gate terminals of MPbg3 and MPbg4 are coupled together and to the drain terminal of MPbg4. In one embodiment, the drain terminal of MPbg4 is coupled to the Second bias node to provide Second bias voltage. In one embodiment, gate terminals of MPbg5 and MPbg6 are coupled together, and to ground. In other embodiments, Second bias may be tapped from other nodes in the series coupled p-type transistor stack. In one embodiment, voltage divider 400 is shared among several word-line drivers. In another embodiment, voltage divider 400 can be power gated when the processor having the voltage divider is operating in low power mode.

Figure 5:
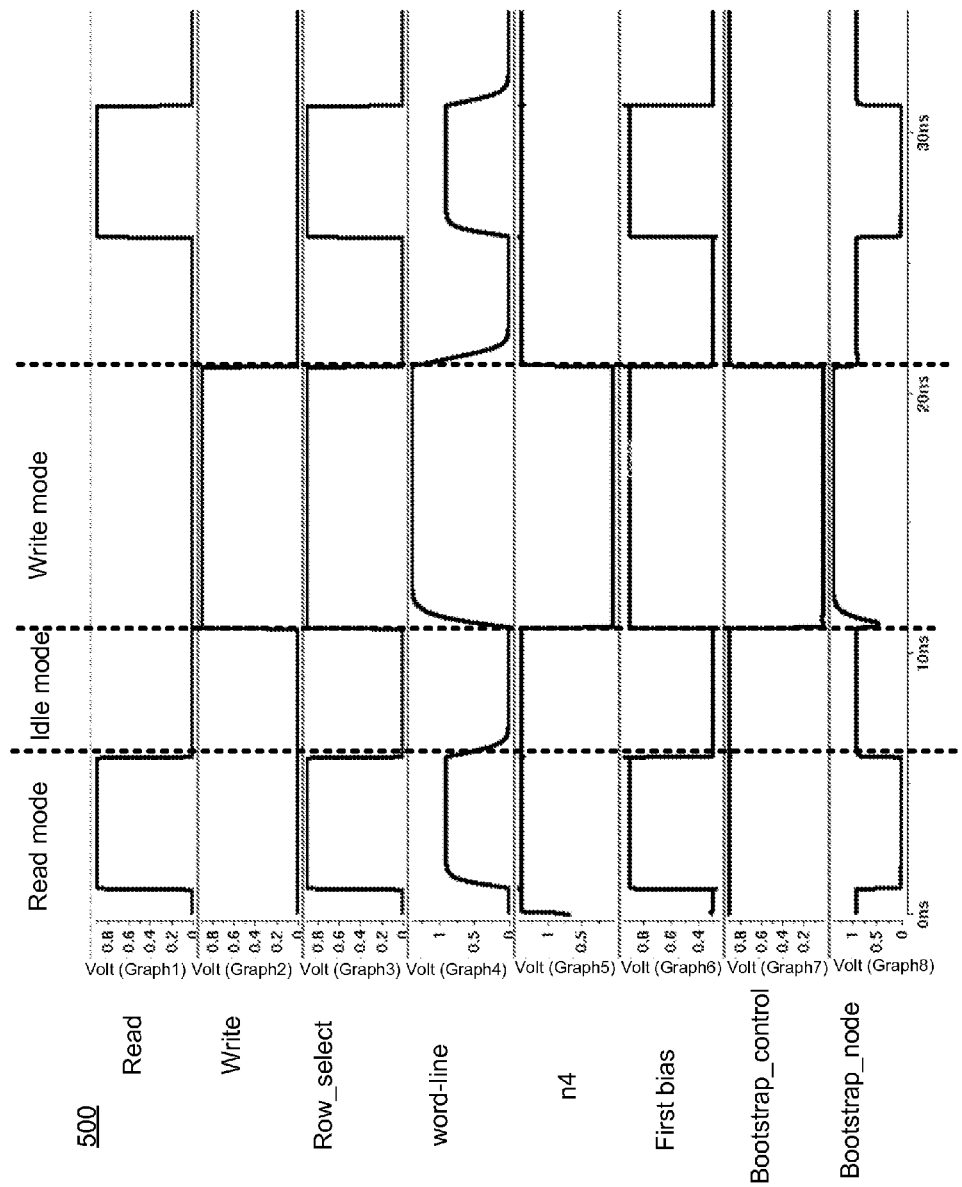
FIG. 5 illustrates a plot showing voltages of various nodes of the high-voltage tolerant word-line driver during read and write operations, according to one embodiment of the disclosure.

FIG. 5 illustrates a plot 500 showing voltages of various nodes of the high-voltage tolerant word-line driver during read and write operations, according to one embodiment of the disclosure. It is pointed out that those elements of FIG. 5 having the same reference numbers (or names) as the elements of any other figure can operate or function in any manner similar to that described, but are not limited to such.

Here, x-axis is time and y-axis is voltage. The waveforms from top to bottom in plot 500 are voltages on Read line, Write line, Row_select line, word-line, node n4, First bias node, node Bootstrap_control, and node Bootstrap_node. The waveforms provide a visual description of the idle mode, read mode, and write modes discussed with reference to FIG. 3.

Figure 6:
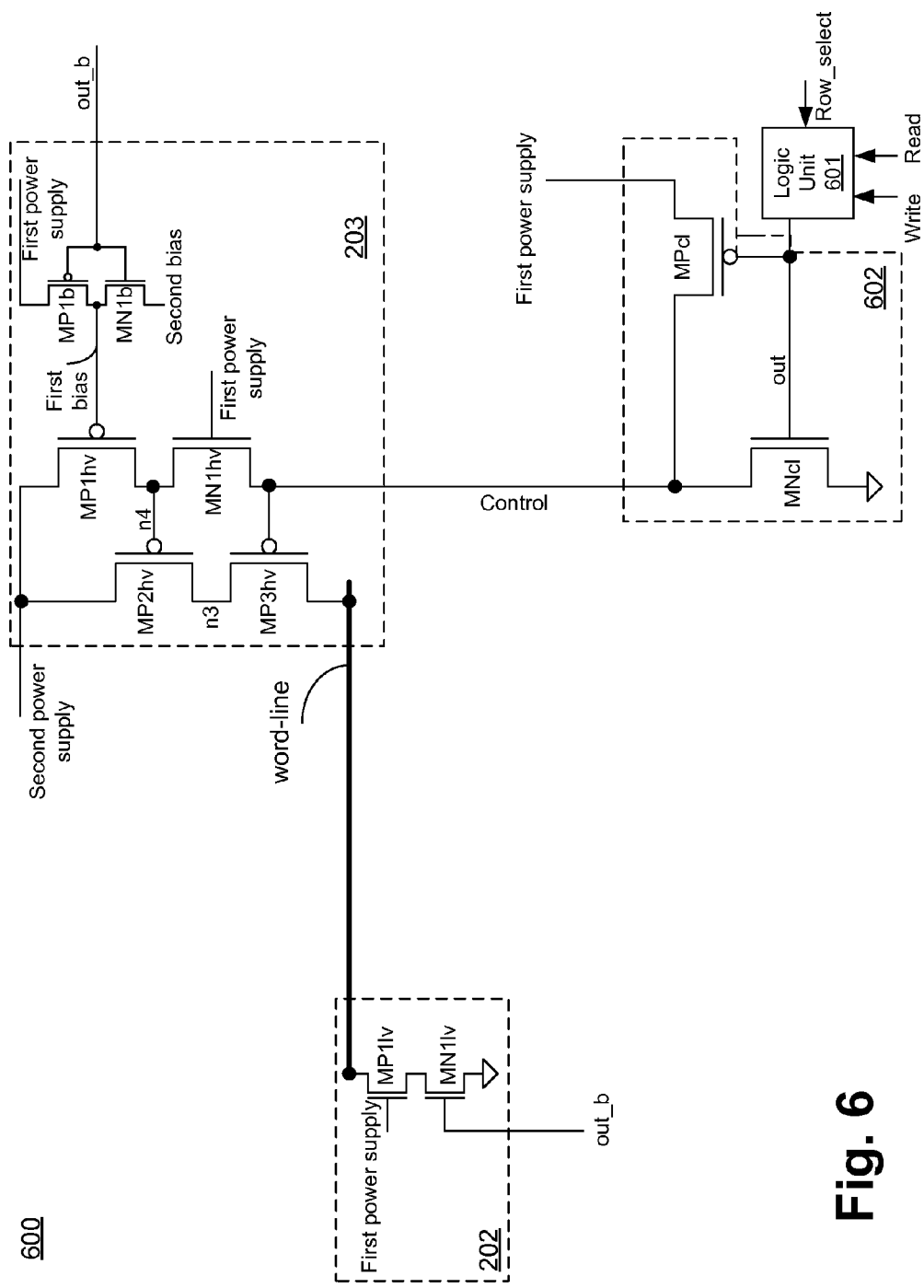
FIG. 6 illustrates another circuit of the high-voltage tolerant word-line driver, according to one embodiment of the disclosure.

FIG. 6 illustrates another circuit 600 of the high-voltage tolerant word-line driver, according to one embodiment of the disclosure. It is pointed out that those elements of FIG. 6 having the same reference numbers (or names) as the elements of any other figure can operate or function in any manner similar to that described, but are not limited to such. So as not to obscure the embodiment of FIG. 6, differences between the embodiment of FIG. 3 and FIG. 6 are described.

In this alternative embodiment of high-voltage tolerant word-line driver, Bootstrap stage 201 is removed, and Bootstrap control logic 204 is simplified as shown by logic units 601 and 602. In one embodiment, Logic Unit 601 performs the following function: out=Row_select AND (Read OR Write). An inverted version of out signal (i.e., out_b signal) controls the gate terminals of MN1*lv*, MP1*b*, and MN1*b*. In one embodiment, Logic Unit 601 comprises a p-type device MPcl and an n-type device MNcl. In one embodiment, gate terminals of MPcl and MNcl are controlled by output out generated by Logic Unit 601. In one embodiment, source terminal of MPcl is coupled to the First power supply. In one embodiment, drain terminals of MPcl and MNcl are coupled to node control which is coupled to MP3*hv* and MN1*hv*. In one embodiment, circuit 600 can be used instead of circuit 300 when area is critical (i.e., smaller area is desired), read performance is not desired, and activity factor is low. In one embodiment, to reduce reliability risk to the devices, the Second power supply is swapped with the First power supply during Read mode. In one embodiment, Read operation can be sped up by upsizing MP2*hv* and MP3*hv*.

Figure 7:
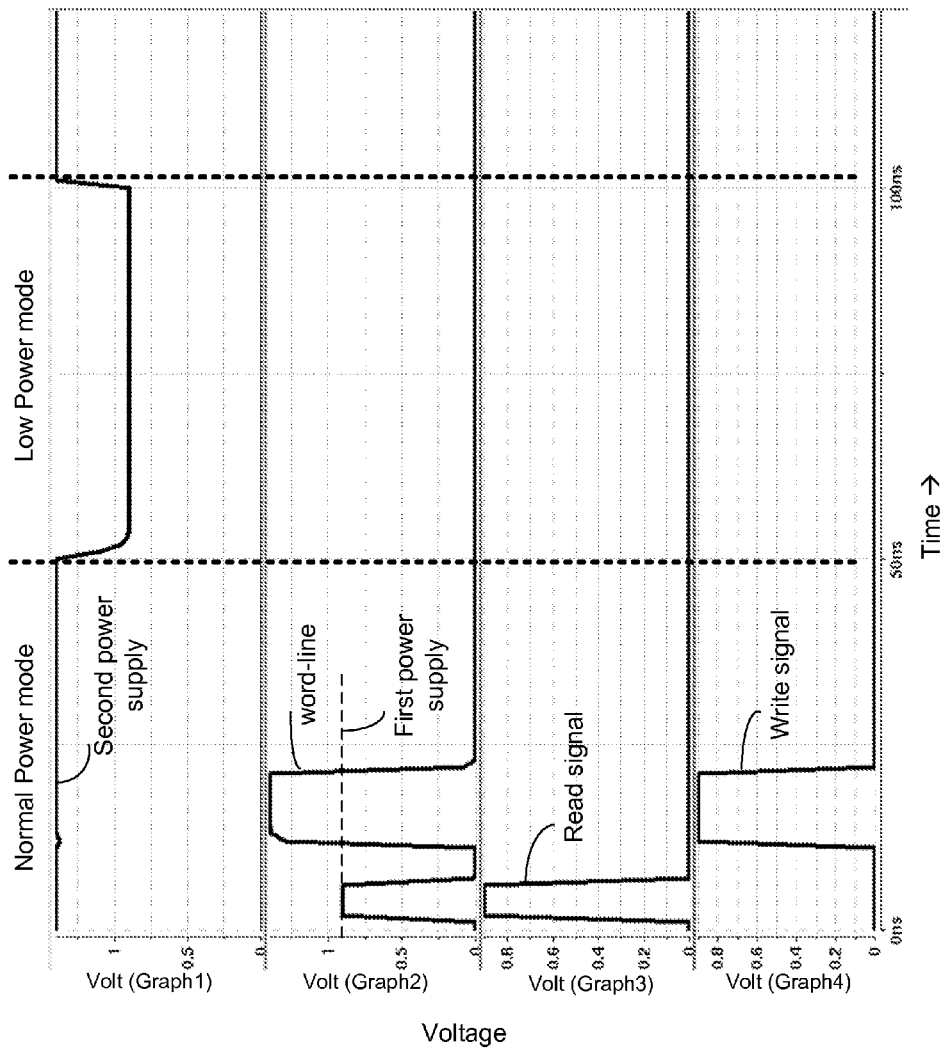
FIG. 7 illustrates a plot showing low power mode operation of the high-voltage tolerant word-line driver, according to one embodiment of the disclosure.

FIG. 7 illustrates a plot 700 showing low power mode operation of the high-voltage tolerant word-line driver, according to one embodiment of the disclosure. It is pointed out that those elements of FIG. 7 having the same reference numbers (or names) as the elements of any other figure can operate or function in any manner similar to that described, but are not limited to such.

Here, x-axis is time and y-axis is voltage. Plot 700 shows normal operation mode (i.e., active mode) during normal read and write operations. During normal operation, in one embodiment, word-line is raised to the First power supply during read mode, and then raised to the Second power supply during write mode. In one embodiment, during low power mode (e.g., Sleep mode) the Second power supply is replaced with the First power supply, where the First power supply is lower than the Second power supply. In one embodiment, during low power mode, the First power supply is lowered by threshold voltage of a transistor. In one embodiment, during low power mode, bulk terminals of MP1*bs*, MP2*bs*, MP3*bs*, MP1*hv*, MP2*hv*, and MP3*hv* are tied to the Second power supply. In one embodiment, any combination of the above low power mode techniques may be used.

Figure 8:
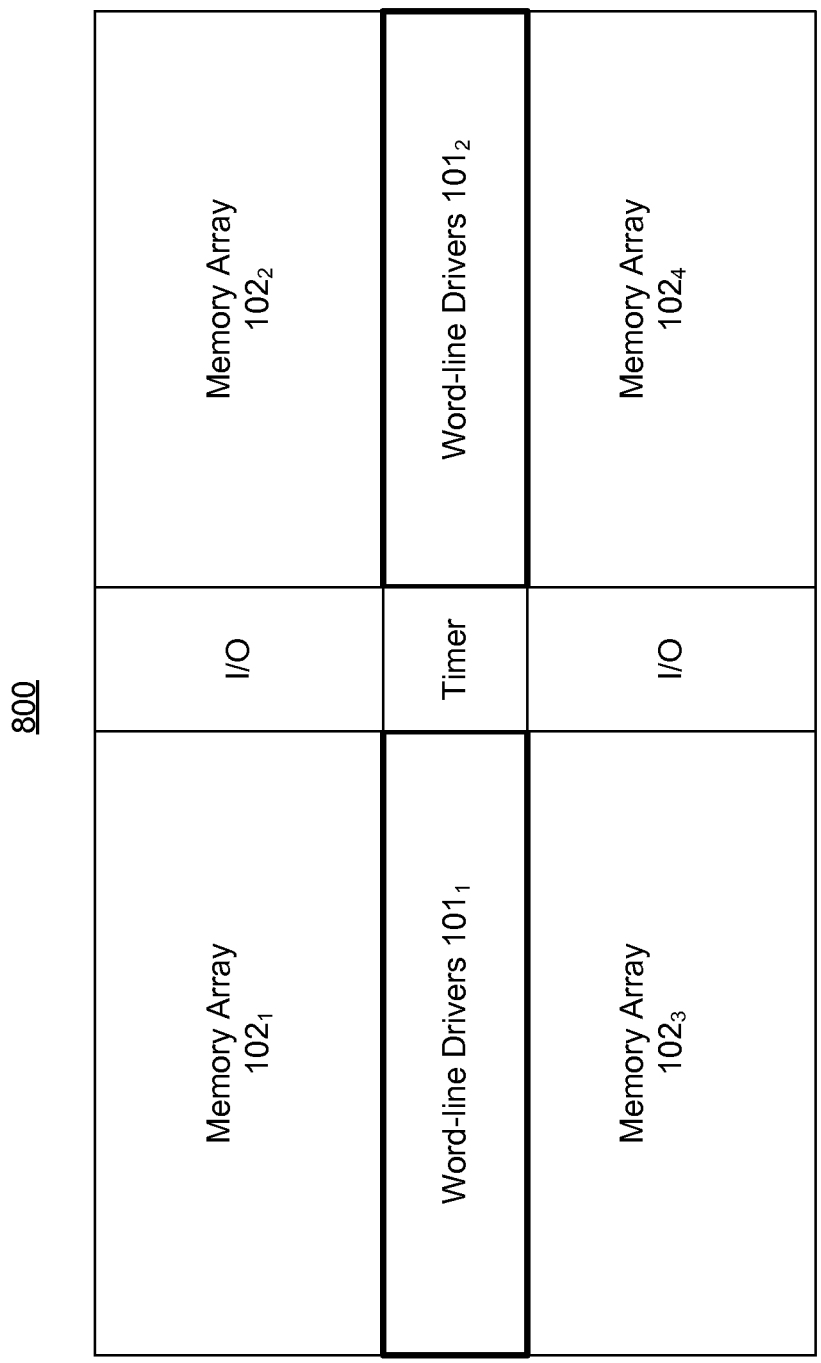
FIG. 8 illustrates a memory floor plan with the high-voltage tolerant word-line drivers, according to one embodiment of the disclosure.

FIG. 8 illustrates memory floor plan 800 with the high-voltage tolerant word-line drivers, according to one embodiment of the disclosure. It is pointed out that those elements of FIG. 8 having the same reference numbers (or names) as the elements of any other figure can operate or function in any manner similar to that described, but are not limited to such.

Floor plan 800 includes memory arrays 102$_{1-4}$, Word-line Drivers 101$_{1-2}$, Timer, and I/Os. While Floor plan 800 shows four memory arrays and two Word-line drivers, any combination and number of memory arrays and Word-line drivers may be used. In one embodiment, Word-line Drivers 101$_1$ are shared between Memory arrays 102$_1$ and 102$_3$. In one embodiment, Word-line Drivers 101$_2$ are shared between Memory arrays 102$_2$ and 102$_4$.

Figure 9:
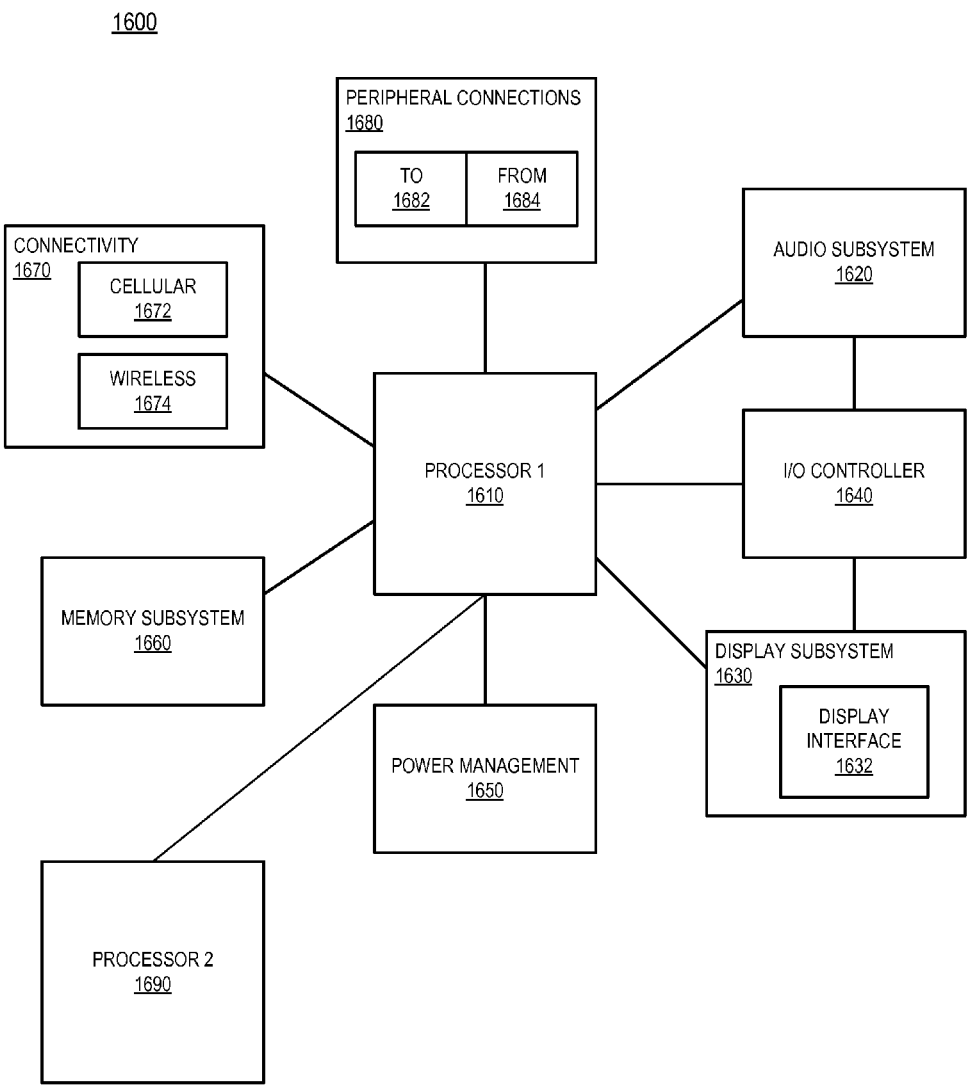
FIG. 9 is a smart device or a computer system or an SoC (System-on-Chip) with high-voltage tolerant word-line driver, according to one embodiment of the disclosure.

FIG. 9 illustrates a smart device or a computer system or a SoC (System-on-Chip) with high-voltage tolerant word-line driver, according to one embodiment of the disclosure. It is pointed out that those elements of FIG. 9 having the same reference numbers (or names) as the elements of any other figure can operate or function in any manner similar to that described, but are not limited to such.

FIG. 9 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 apparatus with high-voltage tolerant word-line driver described with reference to embodiments. Other blocks of the computing device 1600 may also include apparatus with high-voltage tolerant word-line driver described with reference to embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. Processor 1690 may be optional. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, a word-line driver is provided which comprises: a bootstrap stage coupled to a first power supply and a row select line, wherein the bootstrap stage is operable to raise a voltage level of a word-line to a voltage level of the first power supply according to a logic level of a signal on the row select line; a bootstrap control logic operable to control the bootstrap stage according to the logic level of the signal on the row select line; and a high-voltage tolerant stage coupled to the bootstrap stage and the bootstrap control logic, wherein the high-voltage tolerant stage is operable to raise the voltage level of the word-line to a voltage level of a second power supply according to the logical level of the signal on the row select line.

In one embodiment, the word-line driver of claim 1 further comprises: a low voltage stage which is operable to lower the voltage level of the word-line to a voltage level of a third power supply according to the logic level of the signal on the row select line. In one embodiment, the third power supply is ground, and wherein the voltage level of the second power supply is higher than the voltage level of the first power supply. In one embodiment, the low voltage stage comprises: a first transistor coupled to the word-line, the first transistor having a gate terminal coupled to the first power supply; and a second transistor coupled in series with the first transistor, the second transistor controllable by the signal on the row select line, the second transistor operable to couple the third power supply to the word-line.

In one embodiment, the bootstrap control logic comprises a NAND gate powered by the first power supply, the NAND gate having a first input coupled to the row select line, and a second input coupled to one of read or write control lines. In one embodiment, the bootstrap stage comprises: a first p-type transistor coupled to the first power supply and the word-line, the first p-type transistor having a gate terminal coupled to a bootstrap node; and a second p-type transistor coupled to the first power supply, wherein a gate terminal of the second p-type transistor is controllable by a signal generated by performing an AND logic function between a signal on the row select line and a read signal.

In one embodiment, the bootstrap stage comprises: a first p-type transistor coupled to the first power supply and the word-line, the first p-type transistor having a gate terminal coupled to a bootstrap node; a second p-type transistor coupled to the first power supply, the row select line, and the bootstrap node; and a third p-type transistor coupled to the word-line and the bootstrap node, the third p-type transistor having a gate terminal controllable by an output of the bootstrap control logic.

In one embodiment, the first, second, and third p-type devices having respective bulk terminals coupled to the second power supply. In one embodiment, the bootstrap stage comprises: a first n-type transistor coupled in series with the third p-type transistor, the first n-type transistor having a gate terminal coupled to the first power supply; a second n-type transistor coupled in series with the first n-type transistor, the second n-type transistor having a gate terminal coupled to one of read or write control lines; and a third n-type transistor coupled in series with the second n-type transistor, the third n-type transistor having a gate terminal coupled to the row select line.

In one embodiment, the high voltage stage comprises an integrated voltage level shifter. In one embodiment, the high voltage stage comprises: a biasing stage controllable by the signal on the row select line, the biasing stage to generate a first bias; a first p-type transistor having a gate terminal controllable by the first bias, the first p-type transistor coupled to the second power supply; and a first n-type transistor coupled in series with the first p-type transistor, the first n-type transistor having a gate terminal coupled to the first power supply, and a source terminal coupled to an output of the bootstrap control logic.

In one embodiment, the high voltage stage comprises: a second p-type transistor having a gate terminal coupled to a drain terminal of the first p-type transistor, the second p-type device coupled to the second power supply. In one embodiment, the high voltage stage comprises: a third p-type transistor coupled in series with the second p-type transistor, the third p-type transistor having a gate terminal controllable by the output of the bootstrap logic, and wherein the third p-type transistor is coupled to the word-line. In one embodiment, the first, second, and third p-type transistors having respective bulk terminals coupled to the second power supply.

In one embodiment, the biasing stage comprises: a first p-type transistor coupled to the first power supply, the first p-type transistor having a gate terminal controllable by the signal on the row select line; and a first n-type transistor coupled in series with the first p-type transistor, the first n-type transistor having a source terminal to receive a second bias, wherein drain terminals of the first p-type transistor and the first n-type transistor respectively to provide the first bias. In one embodiment, the second bias is generated by a voltage divider. In one embodiment, all transistors of the bootstrap stage, the bootstrap control logic, the high voltage stage, and the low voltage stage have the same gate oxide thicknesses.

In another example, a system is provided which comprises: a processor having a memory and a word-line driver as discussed above. In one embodiment, the system further comprises a wireless interface for allowing the processor to communicatively couple to another device. In one embodiment, the system further comprises a display unit. In one embodiment, the display unit is a touch screen. In one embodiment, the memory is one of: an MRAM; an 6T SRAM; an 8T SRAM; or a resistive memory cell.

In another example, a memory is provided which comprises: an array of memory cells; and a plurality of word-line drivers coupled to the array, wherein each of the word-line drivers of the plurality is operable to switch a voltage level of a word-line to one of: first power supply, second power supply, or third power supply, wherein the second power supply is higher than the first power supply, and wherein transistors of the word-line driver have same gate oxide thicknesses. In one embodiment, each memory cells of the memory cells is one of: a 6T SRAM cell; an 8T SRAM cell; an MRAM cell; or a resistive memory cell.

In another example, a word-line driver is provided which comprises: a high-voltage tolerant stage to receive first and second power supplies, the high-voltage tolerant stage operable to raise a voltage level of a word-line to a voltage level of a second power supply according to logic levels of signals on row select line, read line, and write line; and a control logic operable to control the high-voltage stage according to the logic levels of the signals on the row select line, the read line, and the write line.

In one embodiment, the word-line driver further comprises: a low voltage stage which is operable to lower the voltage level of the word-line to a voltage level of a third power supply according to the logic levels of signals on the row select line, the read line, and the write line. In one embodiment, the third power supply is ground, and wherein the voltage level of the second power supply is higher than the voltage level of the first power supply. In one embodiment, the high voltage stage comprises an integrated voltage level shifter.

In one embodiment, the high voltage stage comprises: a biasing stage controllable by the signal on the row select line, the biasing stage to generate a first bias; a first p-type transistor having a gate terminal controllable by the first bias, the first p-type transistor coupled to the second power supply; and a first n-type transistor coupled in series with the first p-type transistor, the first n-type transistor having a gate terminal coupled to the first power supply, and a source terminal coupled to an output of the control logic. In one embodiment, the high voltage stage comprises: a second p-type transistor having a gate terminal coupled to a drain terminal of the first p-type transistor, the second p-type device coupled to the second power supply.

In one embodiment, the high voltage stage comprises: a third p-type transistor coupled in series with the second p-type transistor, the third p-type transistor having a gate terminal controllable by the output of the control logic, and wherein the third p-type transistor is coupled to the word-line. In one embodiment, the first, second, and third p-type transistors having respective bulk terminals coupled to the second power supply. In one embodiment, the biasing stage comprises: a first p-type transistor coupled to the first power supply, the first p-type transistor having a gate terminal controllable by the signal on the row select line; and a first n-type transistor coupled in series with the first p-type transistor, the first n-type transistor having a source terminal to receive a second bias, wherein drain terminals of the first p-type transistor and the first n-type transistor respectively to provide the first bias.

In one embodiment, the second bias is generated by a voltage divider. In one embodiment, the control logic comprises: a first p-type transistor coupled with the first n-type transistor of the high-voltage stage, the first p-type transistor having a gate terminal controllable by the logic levels of signal on the row select line, the read line, and the write line, wherein the first p-type transistor is coupled to the first power supply. In one embodiment, the control logic comprises: a first n-type transistor coupled to the first p-type transistor of the control logic, the first n-type transistor controllable by the logic levels of signals on the row select line, the read line, and the write line.

In another example, a system is provided which comprises: a processor having a memory and a word-line driver as discussed above. In one embodiment, the system further comprises a wireless interface for allowing the processor to communicatively couple to another device. In one embodiment, the system further comprises a display unit. In one embodiment, the display unit is a touch screen. In one embodiment, the memory is one of: an MRAM; an 6T SRAM; an 8T SRAM; or a resistive memory cell.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A word-line driver comprising:
    a bootstrap stage coupled to a first power supply and a row select line, wherein the bootstrap stage is operable to raise a voltage level of a word-line to a voltage level of the first power supply according to a logic level of a signal on the row select line;
    a bootstrap control logic operable to control the bootstrap stage according to the logic level of the signal on the row select line, wherein the bootstrap control logic comprises a NAND gate powered by the first power supply, the NAND gate having a first input coupled to the row select line and a second input coupled to one of read or write control lines; and
    a high-voltage tolerant stage coupled to the bootstrap stage and the bootstrap control logic, wherein the high-voltage tolerant stage is operable to raise the voltage level of the word-line to a voltage level of a second power supply according to the logical level of the signal on the row select line.

2. The word-line driver of claim 1 further comprises:
a low voltage stage which is operable to lower the voltage level of the word-line to a voltage level of a third power supply according to the logic level of the signal on the row select line.

3. The word-line driver of claim 2, wherein the third power supply is ground, and wherein the voltage level of the second power supply is higher than the voltage level of the first power supply.

4. The word-line driver of claim 2, wherein the low voltage stage comprises:
a first transistor coupled to the word-line, the first transistor having a gate terminal coupled to the first power supply; and
a second transistor coupled in series with the first transistor, the second transistor controllable by the signal on the row select line, the second transistor operable to couple the third power supply to the word-line.

5. The word-line driver of claim 1, wherein the bootstrap stage comprises:
a first p-type transistor coupled to the first power supply and the word-line, the first p-type transistor having a gate terminal coupled to a bootstrap node; and
a second p-type transistor coupled to the first power supply, wherein a gate terminal of the second p-type transistor is controllable by a signal generated by performing an AND logic function between a signal on the row select line and a read signal.

6. The word-line driver of claim 1, wherein the bootstrap stage comprises:
a first p-type transistor coupled to the first power supply and the word-line, the first p-type transistor having a gate terminal coupled to a bootstrap node;
a second p-type transistor coupled to the first power supply, the row select line, and the bootstrap node; and
a third p-type transistor coupled to the word-line and the bootstrap node, the third p-type transistor having a gate terminal controllable by an output of the bootstrap control logic.

7. The word-line driver of claim 6, wherein the first, second, and third p-type devices having respective bulk terminals coupled to the second power supply.

8. The word-line driver of claim 6, wherein the bootstrap stage comprises:
a first n-type transistor coupled in series with the third p-type transistor, the first n-type transistor having a gate terminal coupled to the first power supply;
a second n-type transistor coupled in series with the first n-type transistor, the second n-type transistor having a gate terminal coupled to one of read or write control lines; and
a third n-type transistor coupled in series with the second n-type transistor, the third n-type transistor having a gate terminal coupled to the row select line.

9. The word-line driver of claim 1, wherein the high voltage stage comprises an integrated voltage level shifter.

10. The word-line driver of claim 1, wherein the high voltage stage comprises:
a biasing stage controllable by the signal on the row select line, the biasing stage to generate a first bias;
a first p-type transistor having a gate terminal controllable by the first bias, the first p-type transistor coupled to the second power supply; and
a first n-type transistor coupled in series with the first p-type transistor, the first n-type transistor having a gate terminal coupled to the first power supply, and a source terminal coupled to an output of the bootstrap control logic.

11. The word-line driver of claim 10, wherein the high voltage stage comprises:
a second p-type transistor having a gate terminal coupled to a drain terminal of the first p-type transistor, the second p-type device coupled to the second power supply; and
a third p-type transistor coupled in series with the second p-type transistor, the third p-type transistor having a gate terminal controllable by the output of the bootstrap logic, and wherein the third p-type transistor is coupled to the word-line.

12. The word-line driver of claim 11, wherein the first, second, and third p-type transistors having respective bulk terminals coupled to the second power supply.

13. The word-line driver of claim 10, wherein the biasing stage comprises:
a first p-type transistor coupled to the first power supply, the first p-type transistor having a gate terminal controllable by the signal on the row select line; and
a first n-type transistor coupled in series with the first p-type transistor, the first n-type transistor having a source terminal to receive a second bias, wherein drain terminals of the first p-type transistor and the first n-type transistor respectively to provide the first bias.

14. The word-line driver of claim 13, wherein the second bias is generated by a voltage divider.

15. The word-line driver of claim 2, wherein all transistors of the bootstrap stage, the bootstrap control logic, the high voltage stage, and the low voltage stage have the same gate oxide thicknesses.

16. A system comprising:
a processor having a memory and a word-line driver, the word-line driver including:
a bootstrap stage coupled to a first power supply and a row select line wherein the bootstrap stage is operable to raise a voltage level of a word-line to a voltage level of the first power supply according to a logic level of a signal on the row select line;
a bootstrap control logic operable to control the bootstrap stage according to the logic level of the signal on the row select line, wherein the bootstrap control logic comprises a NAND gate powered by the first power supply, the NAND gate having a first input coupled to the row select line and a second input coupled to one of read or write control lines; and
a high-voltage tolerant stage coupled to the bootstrap stage and the bootstrap control logic, wherein the high-voltage tolerant stage is operable to raise the voltage level of the word-line to a voltage level of a second power supply according to the logical level of the signal on the row select line; and
a wireless interface for allowing the processor to communicatively couple to another device.

17. The system of claim 16, wherein the memory is one of:
an MRAM;
an 6T SRAM;
an 8T SRAM; or
a resistive memory cell.

* * * * *